United States Patent
Nagel

(10) Patent No.: US 10,658,575 B2
(45) Date of Patent: May 19, 2020

(54) METHOD FOR MAGNETIC DEVICE ALIGNMENT ON AN INTEGRATED CIRCUIT

(71) Applicant: Everspin Technologies, Inc., Chandler, AZ (US)

(72) Inventor: Kerry Joseph Nagel, Scottsdale, AZ (US)

(73) Assignee: Everspin Technologies, Inc., Chandler, AZ (US)

( * ) Notice: Subject to any disclaimer, the term of this patent is extended or adjusted under 35 U.S.C. 154(b) by 0 days.

(21) Appl. No.: 15/808,996

(22) Filed: Nov. 10, 2017

(65) Prior Publication Data

US 2018/0138396 A1 May 17, 2018

Related U.S. Application Data

(60) Provisional application No. 62/421,563, filed on Nov. 14, 2016.

(51) Int. Cl.
| | |
|---|---|
| *H01L 43/12* | (2006.01) |
| *H01L 23/544* | (2006.01) |
| *H01L 43/02* | (2006.01) |
| *H01L 43/08* | (2006.01) |

(52) U.S. Cl.
CPC ............ *H01L 43/12* (2013.01); *H01L 23/544* (2013.01); *H01L 43/02* (2013.01); *H01L 43/08* (2013.01); *H01L 2223/5446* (2013.01); *H01L 2223/54446* (2013.01); *H01L 2223/54453* (2013.01)

(58) Field of Classification Search
CPC combination set(s) only.
See application file for complete search history.

(56) References Cited

U.S. PATENT DOCUMENTS

2009/0059656 A1\* 3/2009 Kanakasabapathy ........................ H01L 23/544 365/158

\* cited by examiner

*Primary Examiner* — Ratisha Mehta
(74) *Attorney, Agent, or Firm* — Bookoff McAndrews, PLLC

(57) ABSTRACT

Techniques are presented for ensuring alignment marks are available for use and patterning magnetoresistive devices following the deposition of layers used to form the magnetoresistive devices. In some cases, the plurality of layers corresponding to the magnetoresistive devices are selectively etched in order to expose the underlying alignment marks, whereas in other embodiments, the deposition of the plurality of layers is controlled by deposition tool tabs that prevent the materials from obscuring the underlying alignment marks.

20 Claims, 13 Drawing Sheets

METHOD FOR MAGNETIC DEVICE ALIGNMENT ON AN INTEGRATED CIRCUIT

RELATED APPLICATIONS

This application claims priority to and the benefit of U.S. Provisional Application No. 62/421,563, filed Nov. 14, 2016. The content of Application No. 62/421,563 is incorporated by reference herein in its entirety.

TECHNICAL FIELD

The disclosure herein relates generally to magnetoresistive devices and more particularly to techniques for aligning etching operations during formation of magnetoresistive devices on an integrated circuit.

BACKGROUND

Magnetoresistive devices include magnetic sensors and magnetic memory devices such as magnetic random access memory (MRAM). Magnetic memory devices store information by varying the resistance across the memory device such that a read current through a memory cell in the memory device will result in a voltage drop having a magnitude that is based on the information stored in the memory cell. For example, in certain magnetic memory devices, the voltage drop across a magnetic tunnel junction (MTJ) can be varied based on the relative magnetic states of the magnetic layers within the memory cell. In such memory devices, there is typically a portion of the memory cell that has a fixed magnetic state and another portion that has a free magnetic state that is controlled to be either parallel or antiparallel to the fixed magnetic state. Because the resistance through the memory cell changes based on whether the free portion is parallel or antiparallel to the fixed portion, information can be stored by setting the orientation of the free portion. The information is later retrieved by sensing the orientation of the free portion. Such magnetic memory devices are well known in the art.

Manufacturing magnetoresistive devices, including MTJ devices, includes a sequence of processing steps during which many layers of materials are deposited and then patterned to form a magnetoresistive stack and the electrodes used to provide electrical connections to the magnetoresistive stack. The magnetoresistive stack includes the various layers that make up the free and fixed portions of the device as well as one or more dielectric layers that provide at least one the tunnel junction for the MTJ device. In many instances, the layers of material are very thin—on the order of a few or tens of angstroms. Similarly, the dimensions of such layers after patterning and etching are extremely small, and small deviations or imperfections during processing can have a significant impact on device performance.

Because an MRAM device may include millions of MTJ elements, precise processing steps used in manufacturing the devices can contribute to increased densities by allowing devices to be placed in close proximity without unwanted interaction. Moreover, such accurate processing helps to minimize deviations in device characteristics, such as switching voltages, across devices included in the MRAM. Therefore, it is desirable to provide techniques for manufacturing such devices that support increased densities and promote minimizing the variance of certain characteristics amongst devices.

DETAILED DESCRIPTION

Figure 1:
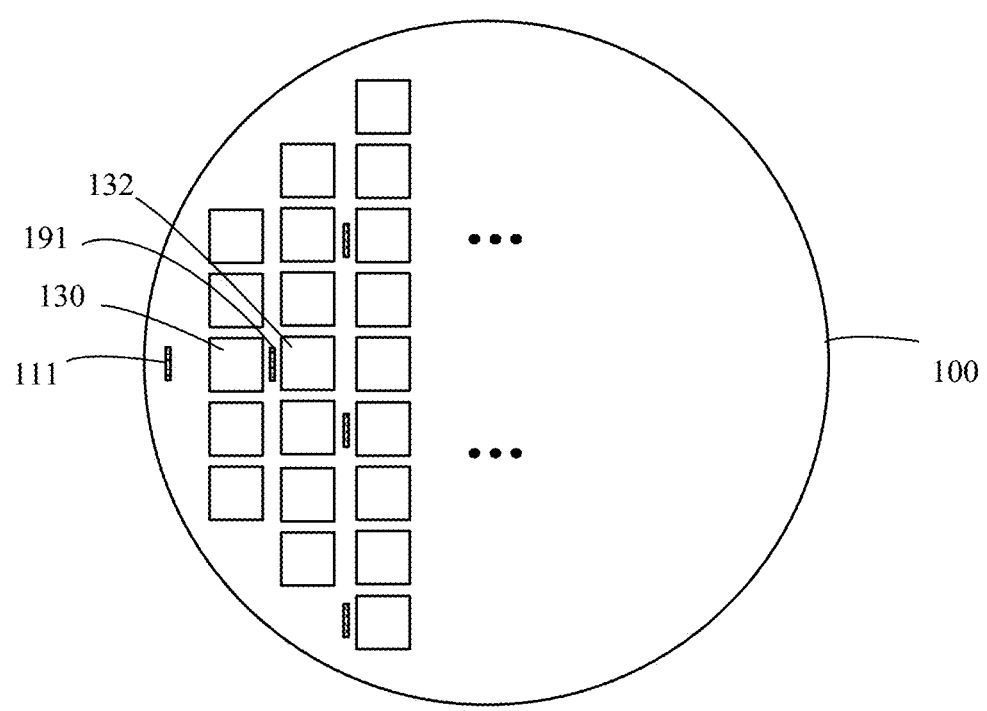
FIG. 1 illustrates a view of a substrate upon which a number of integrated circuit devices that include magnetoresistive devices are formed.

The following detailed description is merely illustrative in nature and is not intended to limit the embodiments of the subject matter or the application and uses of such embodiments. Any implementation described herein as exemplary is not necessarily to be construed as preferred or advantageous over other implementations.

For simplicity and clarity of illustration, the figures depict the general structure and/or manner of construction of the various embodiments. Descriptions and details of well-known features and techniques may be omitted to avoid unnecessarily obscuring other features. Elements in the figures are not necessarily drawn to scale: the dimensions of some features may be exaggerated relative to other elements to improve understanding of the example embodiments. For example, one of ordinary skill in the art appreciates that the cross-sectional views are not drawn to scale and should not be viewed as representing proportional relationships between different layers. The cross-sectional views are provided to help illustrate the processing steps performed by simplifying the various layers to show their relative positioning. Moreover, while certain layers and features are illustrated with straight 90-degree edges, in actuality or practice such layers may be more "rounded" and gradually sloping.

The terms "comprise," "include," "have" and any variations thereof are used synonymously to denote non-exclusive inclusion. The term "exemplary" is used in the sense of "example," rather than "ideal."

During the course of this description, like numbers may be used to identify like elements according to the different figures that illustrate the various exemplary embodiments.

For the sake of brevity, conventional techniques related to semiconductor processing may not be described in detail herein. The exemplary embodiments may be fabricated using known lithographic processes. The fabrication of integrated circuits, microelectronic devices, micro electro mechanical devices, microfluidic devices, and photonic devices involves the creation of several layers of materials that interact in some fashion. One or more of these layers may be patterned so various regions of the layer have different electrical or other characteristics, which may be interconnected within the layer or to other layers to create electrical components and circuits. These regions may be created by selectively introducing or removing various materials. The patterns that define such regions are often created by lithographic processes. For example, a layer of photoresist is applied onto a layer overlying a wafer substrate. A photo mask (containing clear and opaque areas) is used to selectively expose the photoresist by a form of radiation, such as ultraviolet light, electrons, or x-rays. Either the photoresist exposed to the radiation, or that not exposed to the radiation, is removed by the application of a developer. An etch may then be applied to the underlying layer not protected by the remaining photoresist such that the layer overlying the substrate is patterned. Alternatively, an additive process can be used in which a structure is built up using the photoresist as a template.

There are many inventions described and illustrated herein, as well as many aspects and embodiments of those inventions. In one aspect, the described embodiments relate to, among other things, methods of manufacturing a magnetoresistive-based device having one or more electrically conductive electrodes or conductors on either side of a magnetic material stack. The magnetic material stack may include many different layers of material, where some of the layers include magnetic materials, whereas others do not. In one embodiment, the methods of manufacturing include forming the layers for the magnetoresistive device and then masking and etching those layers to produce a magnetic tunnel junction (MTJ) device. Examples of MTJ devices include transducers such as electromagnetic sensors as well as magnetic memory cells.

Magnetoresistive devices are typically formed to include a top electrode and a bottom electrode that permit access to the device by allowing for connectivity to other circuit elements. Between the electrodes is a set of layers, including a fixed layer and a free layer on either side of a dielectric layer that forms a tunnel barrier. In some embodiments, the fixed layer achieves its fixed magnetization based on interaction with an antiferromagnetic material. In other embodiments, the fixed magnetization may be achieved through other means, including the manner in which the fixed layer was formed, shape anisotropy, etc.

In manufacturing such magnetoresistive devices, a set of layers is first deposited on the wafer and then patterned and etched in order to define the electrodes and the various layers there between. In order to pattern and etch the layers deposited to form the magnetoresistive devices, the processing tools use alignment marks included on the substrate on which the integrated circuit including the magnetoresistive devices is formed. For example, the alignment marks may be used by photolithographic tools for positioning reticles such that the magnetoresistive devices are formed in proper alignment with underlying features included on the integrated circuit. Such alignment marks, which are typically included or formed in layers of material underlying the plurality of layers corresponding to the magnetoresistive device can be obscured by opaque layers included in the plurality of layers for the magnetoresistive device. In order to expose the alignment marks or prevent the alignment marks from being obscured, different techniques can be employed to ensure the alignment marks are available for the processing steps performed in manufacturing the magnetoresistive devices.

In some embodiments, which are discussed in more detail below, a layer of patterned photoresist is formed and used to selectively etch through opaque layers overlying the alignment marks. In some embodiments, the alignment marks are included near the periphery of the substrate on which the integrated circuits are formed. For example, the alignment marks may be positioned near the edge of a wafer upon which a number of integrated circuits are being formed. In other embodiments, the alignment marks are included in scribe lines between the integrated circuits on the substrate. For example, the alignment marks may be positioned at multiple locations in the scribe lines between the integrated circuits, where the scribe lines are later used for dicing up the wafer and separating the integrated circuits for subsequent packaging and use. Because the alignment marks are located outside of the area on the substrate corresponding to the integrated circuits formed thereon, the patterning of the photoresist used in etching to expose the alignment marks need not be as accurate as the patterning and positioning required for device formation on the integrated circuit. As such, the patterning used to expose the alignment marks can occur without the alignment marks being visible or detectable. Once the opaque magnetic layers overlying the alignment marks have been etched to expose the alignment marks, the alignment marks can be used as a reference for the more-precise etching operations used in formation of the magnetoresistive devices from the plurality of layers that have been deposited.

In other embodiments where the alignment marks are positioned near the periphery of the substrate, deposition tool tabs can be employed during the deposition of the plurality of layers corresponding to the magnetoresistive device. Such deposition tool tabs are positioned based on the location of the alignment marks and selectively prevent deposition of material corresponding to at least a portion of the plurality of layers in a region corresponding to the alignment marks such that the alignment marks are not obscured by the deposition of the plurality of layers. As such, by avoiding having the alignment marks covered up during deposition of the layers for the magnetoresistive devices, the alignment marks are subsequently available for aligning the processing steps used to form the magnetoresistive devices.

Notably, during formation of the magnetoresistive devices, some of the materials included in the layers within the magnetoresistive device are susceptible to oxidation or other degradation during reactive etching steps as well as steps involving the deposition of interlayer dielectric material that surrounds and isolates the magnetoresistive devices. Such oxidation or degradation can be detrimental as it may interfere with the magnetic behavior of the device or interfere with subsequent processing steps. In particular, sidewalls of the layers of magnetic material included in the free or fixed layer may be vulnerable to the corrosive atmosphere and gases used during depositing of interlayer dielectric material in later processing steps. In addition to the being subject to possible degradation based on exposure to corrosive gases, the formation of contacts or vias in the interlayer dielectric material can result in shorting between the contacts or vias and underlying layers in the magnetoresistive stack, thereby creating unwanted electrical connections that compromise device functionality.

In order to avoid undesirable impacts on layers included in the magnetoresistive device stack structure, encapsulation of the magnetoresistive device either part-way through formation or after formation of the device and prior to deposition of interlayer dielectric material can occur. In some embodiments, the encapsulation includes depositing a layer of insulating, encapsulation material and etching back to only leave the encapsulation material on the sidewalls of the completed magnetoresistive devices. The encapsulation material coats and protects the sidewalls from the corrosive atmosphere created during etching or deposition of interlayer dielectric material. Such encapsulation material can also interfere with detection of the alignment marks, and, as such, some embodiments include avoiding covering up the alignment marks with such encapsulation material by using deposition tool tabs or removal of such encapsulation material from regions overlying the alignment marks by selective etching.

In some embodiments, an array of magnetoresistive devices is included on an integrated circuit with other circuitry, including, for example, logic devices. In one example, an array of MRAM devices is included on an integrated circuit with a processor and/or other logic circuitry. In such embedded embodiments, the processing steps for the magnetoresistive devices may overlap with the processing steps for the logic devices such that some processing steps are used to form structures in both the magnetoresistive device portion of the integrated circuit and the logic portion of the integrated circuit. In such embodiments, exposure of the alignment marks following the deposition of the plurality of layers corresponding to the magnetoresistive devices can impact not only the subsequent formation of the magnetoresistive devices, but also processing operations for the logic devices or other non-magnetic circuitry that occur following the deposition of the plurality of layers corresponding to the magnetoresistive devices.

FIG. 1 illustrates a substrate 100 on which a plurality of integrated circuit devices, including integrated circuit devices 130 and 132, are formed. Substrate 100 can be a semiconductor wafer commonly used in integrated circuit device manufacturing. Also included on the substrate 100 are alignment marks, including alignment marks 111 and 191. The alignment marks 111 and 191 can be used for positioning reticles used in photolithographic operations corresponding to manufacture of the integrated circuit devices 130 and 132. While the example shown in FIG. 1 includes alignment marks near the edge of the substrate 100 (e.g. alignment mark 111) as well as in the scribe lines between the rows of integrated circuits (e.g. alignment mark 191), some substrates may only include alignment marks in one of those two regions. As discussed below, the present disclosure provides techniques for ensuring that the alignment marks 111 and 191 are visible and useful for alignment steps following deposition of a plurality of layers corresponding to magnetoresistive devices that are included on the integrated circuits 130 and 132.

Figure 2:
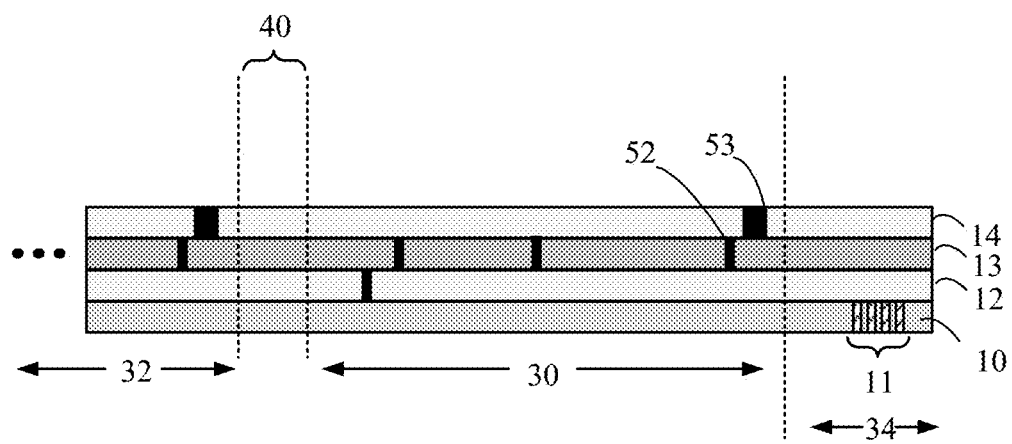
FIGS. 2-17 illustrate cross-sectional views of a substrate and the layers thereon during different stages of the manufacturing in accordance with exemplary embodiments.

FIG. 2 illustrates a cross-sectional view of a portion of a substrate upon which a plurality of integrated circuit devices are being formed. In FIG. 2, a scribe line corresponding to a gap between neighboring integrated circuits as shown as region 40 between the vertical dotted lines. The horizontal region 30 corresponds to one integrated circuit device being formed, whereas the horizontal region 32, which is shown as further extending to the left in the diagram of FIG. 2, corresponds to a separate integrated circuit device. The region 34 corresponds to the periphery of the substrate, which in some embodiments corresponds to the edge of a semiconductor wafer.

FIG. 2 shows a plurality of layers of material deposited on the underlying substrate. The layer 10 may be referred to as a zero layer in that it underlies all other layers used in the manufacture of the integrated circuit device 30. As shown in FIG. 2, alignment marks 11 are formed within the zero layer 10 on the periphery region 34 of the substrate. The alignment marks 11 are used to form different aspects of the integrated circuit device 30. For example, the alignment marks are used for patterning and etching operations used to form integrated circuit device features 52 and 53. Integrated circuit device features 52 and 53 are included in layers 13 and 14, respectively, where layers 12-14 are layers that underlie magnetoresistive devices that are later formed. In the specific example of FIG. 2, integrated circuit device feature 53 represents a via structure allowing for electrical contact between a bottom portion of a magnetoresistive device that is later formed and traces or other circuit elements underlying the magnetoresistive device. For example, the via 53 may provide contact to a metal trace that lies within layer 13 or between layers 13 and 14, where the metal trace attaches to a selection transistor that enables the magnetoresistive device to be selectively accessed.

In some embodiments, logic devices or other circuit elements are formed in layers 12-14 prior to formation of overlying magnetoresistive devices. For example, processors or other logic circuits may be formed in layers 12-14 prior to later formation of magnetoresistive devices overlying those logic circuits. In other embodiments, the magnetoresistive devices may be formed prior to, or in conjunction with, other circuit elements included on the integrated circuit 30. The magnetoresistive devices may be formed over, under, or in parallel levels with other circuitry included on the integrated circuits.

In the embodiment of FIG. 2, the alignment marks 11 are included in the zero layer 10 near the periphery of the substrate. Alignment marks are not included within the scribe line 40 in the example embodiment of FIG. 2. In the example shown in FIG. 2, it is presumed that layers 12-14 not obscure alignment marks 11 from detection. For example, layers 12-14 may be transparent in the sense that the alignment marks 11 are visible through layers 12-14.

In the example shown in FIG. 2 in which the integrated circuit device feature 53 represents a via used to connect an overlying magnetoresistive device to underlying circuitry, the processing used to form the via may require a polishing step to provide for a very flat and smooth top surface of the via 53 in order to provide a good platform upon which to build the magnetoresistive device. As such, while some prior art alignment techniques involved leaving a physical bump at or near the via 53 which would propagate up through subsequently deposited layers and provide a physical reference for alignment of subsequent processing steps, the need for a smooth surface of the via 53 restricts or eliminates the use of such techniques for alignment. The need for a smooth surface of the via 53 is especially important in on-axis magnetoresistive devices, where the magnetoresistive device sits directly on the via. In such embodiments, the via typically has a larger footprint than the magnetoresistive device formed overlying the via.

Figure 3:
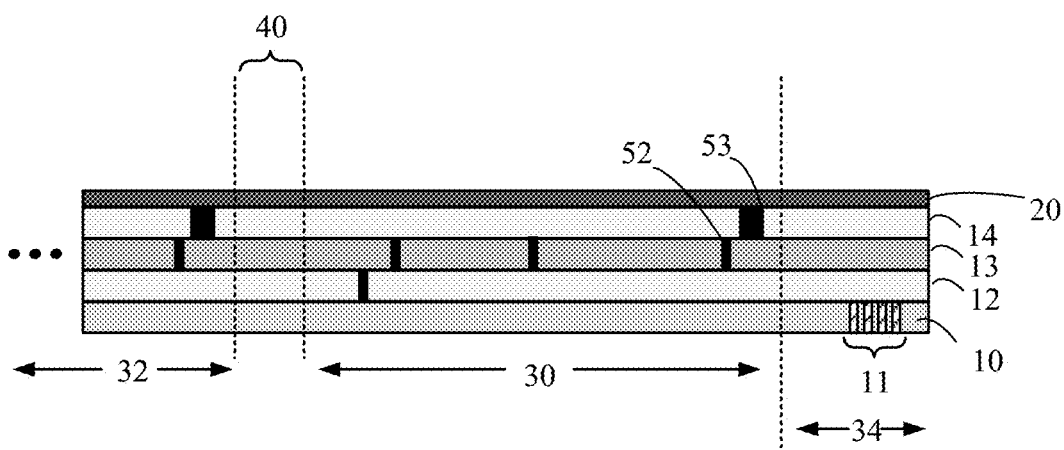

In FIG. 3 a plurality of layers 20 corresponding to the magnetoresistive devices to be formed on the integrated circuit 30 is deposited. Depositing the plurality of layers 20 can include depositing a conductive layer corresponding to a bottom electrode, depositing a first magnetic layer over the first conductive layer, depositing a dielectric layer over the first magnetic layer, depositing a second magnetic layer over the dielectric layer, and depositing another conductive layer corresponding to a top electrode. The plurality of layers 20 includes the conductive layers used for the top and bottom electrodes of the magnetoresistive devices as well as the magnetic and nonmagnetic layers that make up the magnetoresistive stack for the magnetoresistive devices. The magnetoresistive stack includes dielectric material that creates a tunnel junction between different magnetic layers within the magnetoresistive stack, thereby forming a magnetic tunnel junction (MTJ).

Each of the plurality of layers 20 used to form the magnetoresistive device is formed, deposited, grown, sputtered, or otherwise provided. The layers may be deposited using any technique now known or later developed. In an example embodiment, the plurality of layers 20 includes a number of different layers of both magnetic and nonmagnetic material. For example, the layers may include multiple layers of magnetic material, dielectric layers that provide one or more tunnel barriers or diffusion barriers, coupling layers between layers of magnetic material that provide for ferromagnetic or antiferromagnetic coupling, anti-ferromagnetic material, and other layers utilized in magnetoresistive stacks as currently known or later developed. For example, a lower layer of magnetic material may include a set of layers forming a synthetic antiferromagnetic structure (SAF), a dielectric layer may correspond to a tunnel barrier, and an upper layer of magnetic material may include a set of layers corresponding to a synthetic ferromagnetic structure (SYF). Notably, each of the layers included in the magnetoresistive device may be a composite layer that includes multiple sub-layers. Other embodiments may include multiple SAFs, SYFs, and tunnel barriers in addition to the other layers, where the materials and structures are arranged in various combinations and permutations now known or later developed.

The plurality of layers 20 deposited in FIG. 3 includes opaque layers that obscure visibility or other detection of the underlying alignment marks 11. For example, tantalum (Ta), which is commonly used for the bottom electrode in the magnetoresistive device, is opaque and would prevent visual recognition of the underlying alignment marks 11. Similarly, other magnetic or nonmagnetic layers included in the stack may also be opaque, thereby obscuring detection of the underlying alignment marks 11. Because the plurality of layers are blanket deposited across the entire surface of the substrate, any such opaque layers will impede the ability of subsequent processing steps to utilize the alignment marks 11 for patterning and etching the plurality of layers 20. As such, proper alignment and formation of the magnetoresistive devices to be formed from the plurality of layers 20 could be jeopardized. As such, specific steps can be taken in order to expose the alignment marks 11, thereby allowing for their use in patterning and producing the magnetoresistive devices from the plurality of layers 20.

Figure 4:
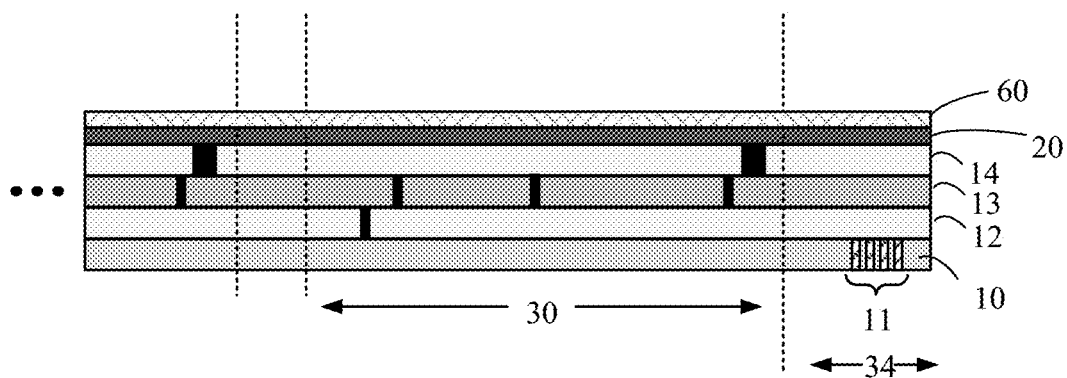
Figure 5:
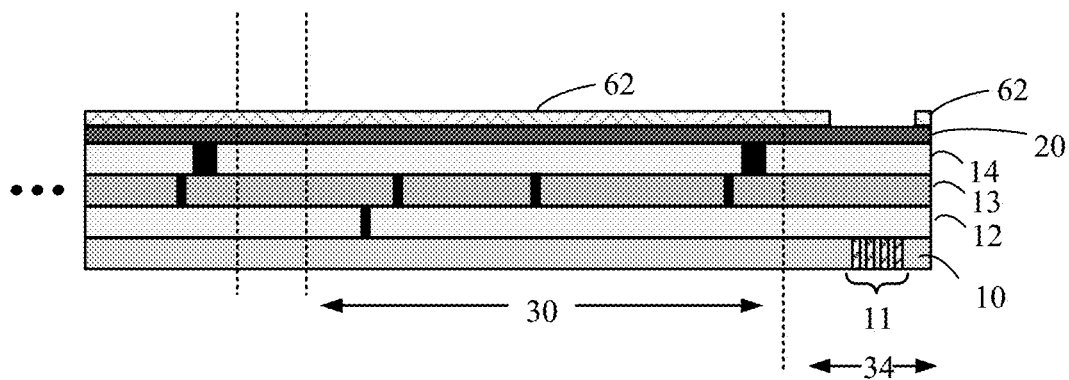

In FIG. 4, a layer of photoresist material 60 is formed over the plurality of layers 20 corresponding to the magnetoresistive device. Following deposition of the layer of photoresist material 60, the layer of photoresist 60 is patterned to produce a first patterned layer of photoresist 62, which is shown in FIG. 5. As shown in FIG. 5, the first patterned layer of photoresist 62 includes a window overlying the alignment marks 11. While the specific photolithographic operations corresponding to formation of the magnetoresistive devices or other devices on the integrated circuit may require a great deal of precision, formation of the window within the first patterned layer of photoresist 62 need not be so precise as its objective is to expose the underlying alignment marks 11. As such, a coarse window can be provided within the first patterned layer of photoresist 62, where the window can be significantly larger than the area corresponding to the alignment marks such that any unintended offset due to the lack of visible alignment marks does not hamper the use of the first patterned layer of photoresist 62 in helping to expose the underlying alignment marks 11.

Figure 6:
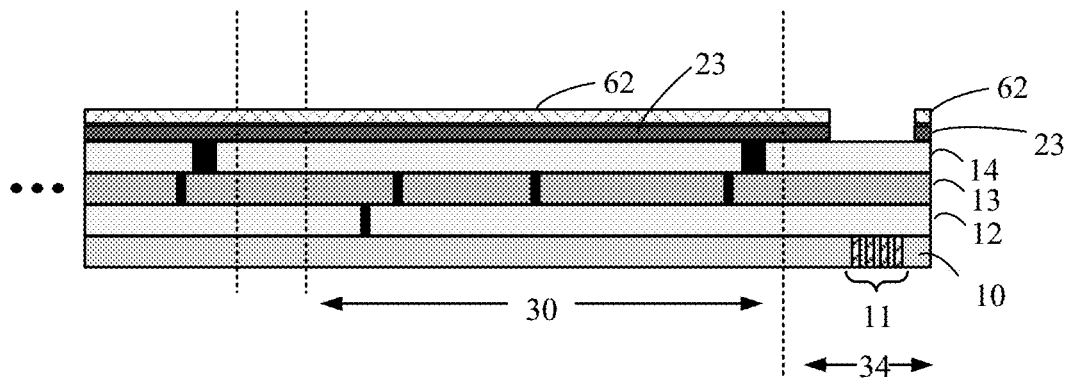

Turning to FIG. 6, an etching operation is used to etch at least a portion of the plurality of layers 20 corresponding to the magnetoresistive device using the first patterned layer of photoresist 62 as a template. In some embodiments, all of the layers included in the plurality of layers 20 are etched in order to expose the underlying alignment marks 11. In other embodiments, the etching need not proceed through all of the layers included in the plurality of layers 20 as long as all of the layers that are opaque or are otherwise preventing detection of the alignment marks 11 are etched. In some embodiments etching at least a portion of the plurality of layers 20 corresponding to the magnetoresistive device using the patterned layer of photoresist 62 as a template removes selected portions of all opaque layers using a single-step etch. In other embodiments, etching at least a portion of the plurality of layers 20 corresponding to the magnetoresistive device using the patterned layer of photoresist 62 uses multiple etching steps, including a first etch and a second etch, where the first and second etches have different etching characteristics. Because the etching performed to reveal the underlying alignment marks is a fairly coarse operation a corrosive, nonselective etch may be employed in order to rapidly perform such etching in a single step. Outside of the window created by the patterned layer of photoresist 62, the remaining portion of the plurality of layers 23 corresponding to the magnetoresistive devices remains intact.

Figure 7:
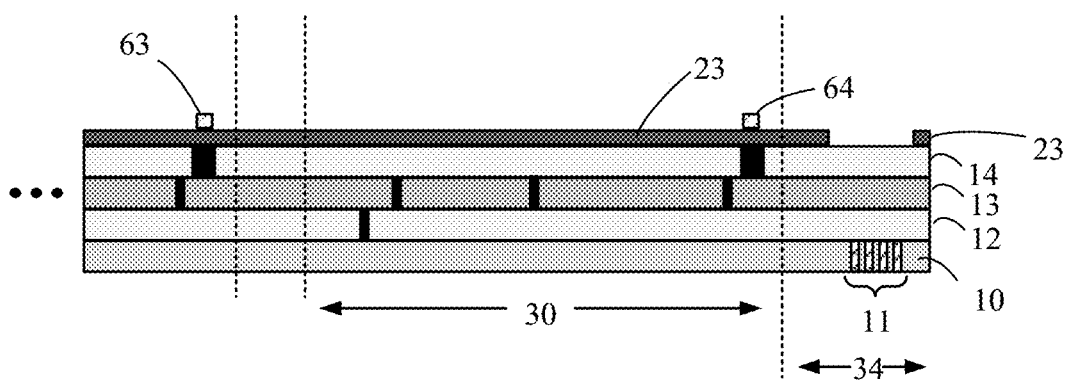

In FIG. 7, the patterned layer of photoresist 62 has been stripped away and replaced with a new patterned layer of photoresist that includes features 63 and 64. Following removal of the patterned layer of photoresist 62, a new layer of photoresist is deposited, and then patterned to produce the patterned layer of photoresist that includes features 63 and 64. The patterning used to produce features 63 and 64 relies on the alignment marks 11 which are now visible due to the etching operations corresponding to the window in the patterned layer of photoresist 62 discussed directly above.

Figure 8:
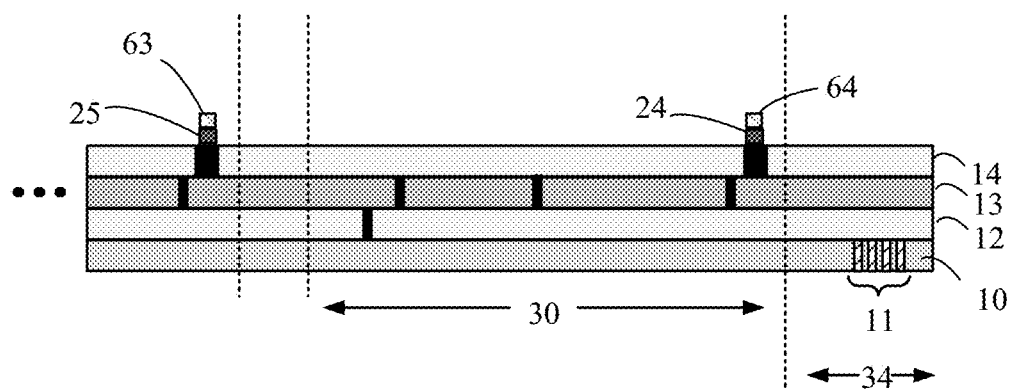

Once the second patterned layer of photoresist that includes the features 63 and 64 is produced, the etching operations corresponding to formation of the magnetoresistive devices can be performed. As shown in FIG. 8, magnetoresistive devices 24 and 25 are formed through such etching operations. Formation of the magnetoresistive devices 24 and 25 includes etching at least a first portion of the plurality of layers corresponding to the magnetoresistive device using the patterned layer of photoresist 63, 64 where such etching forms at least a portion of a magnetic tunnel junction included in the magnetoresistive device. Thus, the etching operations corresponding to formation of the magnetoresistive devices can be performed through a single etching step, or through multiple etching operations, where the various encapsulation or other patterning operations can be included between the multiple etching steps. Each of those operations can rely on the alignment marks 11 which have been made visible by selectively removing the opaque layers of the plurality of layers 20 overlying the alignment marks 11.

In some embodiments, a multi-step etching process may be used to form the magnetoresistive devices, where encapsulation steps are interspersed between the etching operations used to form the magnetoresistive device. In some cases, the encapsulating material may be blanket deposited in a manner that obscure's the underlying alignment marks, where those alignment marks need to be exposed for subsequent alignment operations. Thus, in some examples a further etching operation corresponding to the encapsulation material may be required in order to expose the alignment marks. The further etching operation may be a same etching operation that is used to selectively remove portions of the encapsulation material outside of its intended area of use. For example, if the encapsulation material is only meant to remain on the sidewalls of the magnetoresistive device stack, the etching operation that removes the encapsulation material outside that region can also be employed to remove the encapsulation material obscuring the alignment marks 11. Once the encapsulation material is removed, etching of the remaining portions of the plurality of layers corresponding to the magnetoresistive device can continue with the availability of the alignment marks 11 for performance of those operations.

Figure 9:
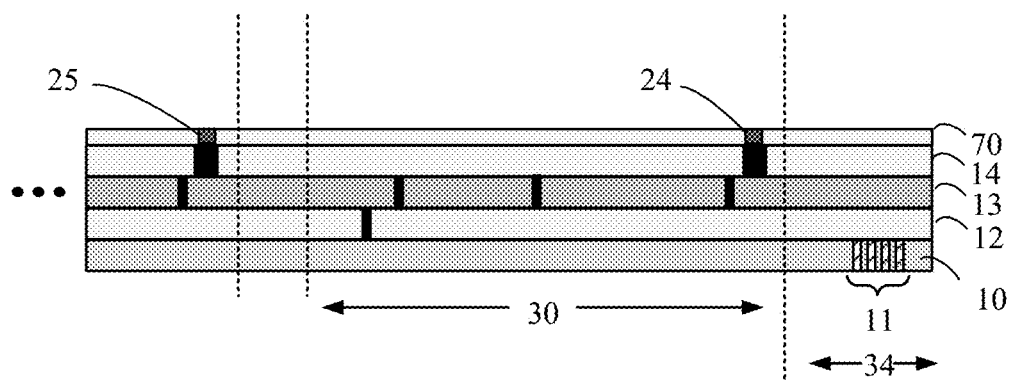
Figure 10:
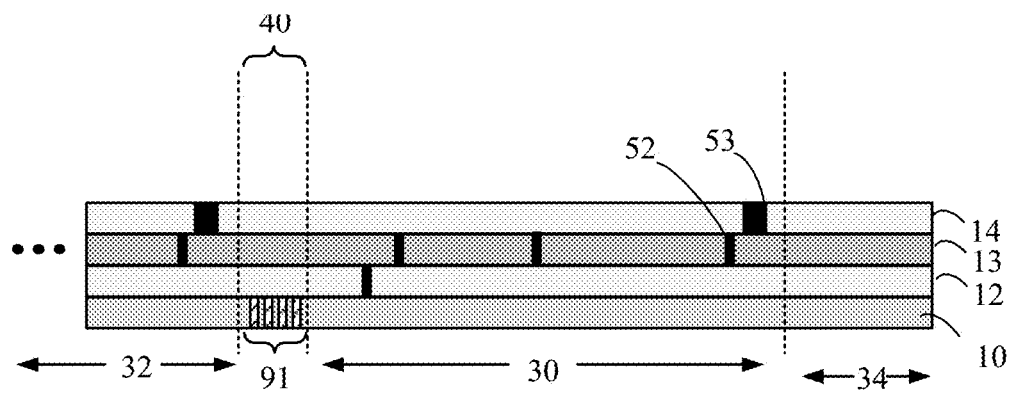

FIG. 9 illustrates the magnetoresistive devices 24 and 25 following removal of the photoresist 63, 64 and deposition of interlayer dielectric material 70. Following deposition of the interlayer dielectric material 70, additional layers may be formed overlying the interlayer dielectric material 70, where those additional layers may provide routing corresponding to connections to the top electrode of the magnetoresistive devices 24, 25 or other support circuitry corresponding to the integrated circuit device 30. By selectively removing opaque layers of the plurality of layers corresponding to the magnetoresistive devices 24, 25 that overlying the alignment marks 11 prior to formation of the magnetoresistive devices 24, 25, the alignment marks 11 can be used in the etching steps used to form those magnetoresistive devices. As such, the added precision provided by the alignment marks 11 is not lost due to the alignment marks being obscured by opaque layers within the plurality of layers corresponding to the magnetoresistive devices.

Figure 11:
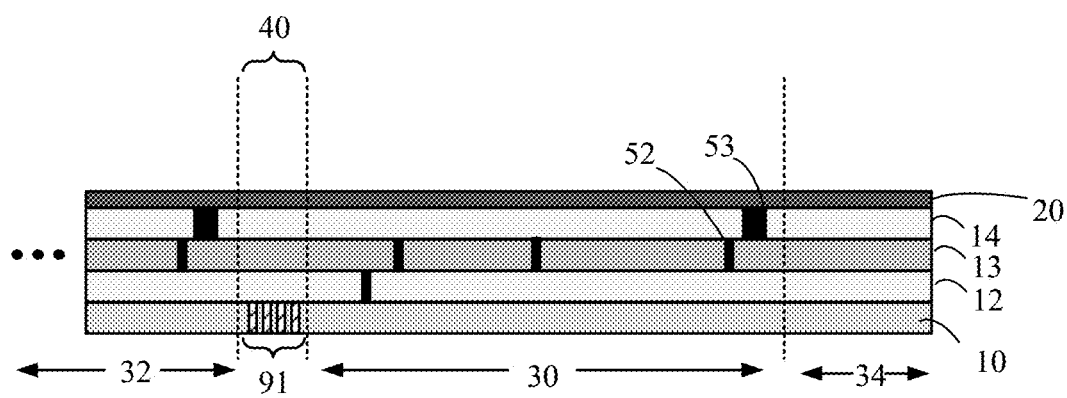

While FIGS. 2-9 corresponds to an embodiment in which the alignment marks 11 are included near the periphery of the substrate, an alternate embodiment is illustrated in FIGS. 10-15. In FIGS. 10-15, the alignment marks 91 are included within the scribe lines of the substrate, including the scribe line 40 illustrated in FIG. 10. As was the case with the previously discussed embodiment, after formation of the plurality of layers 20 corresponding to the magnetoresistive device, the alignment marks 91 may no longer be visible due to the presence of opaque layers within the plurality of layers 20. Thus, as shown in FIG. 11, the alignment marks 91 within the scribe line 40 may not be detectable based on the blanket deposition of the plurality of layers 20.

Figure 12:
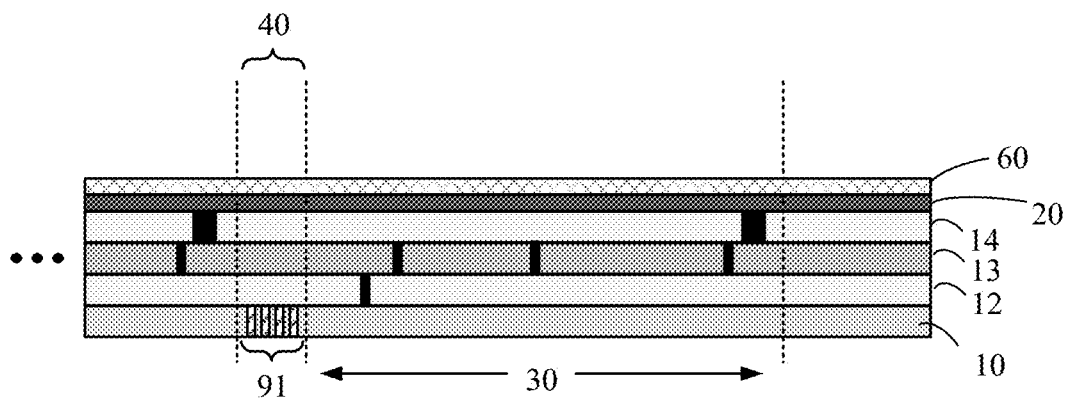
Figure 13:
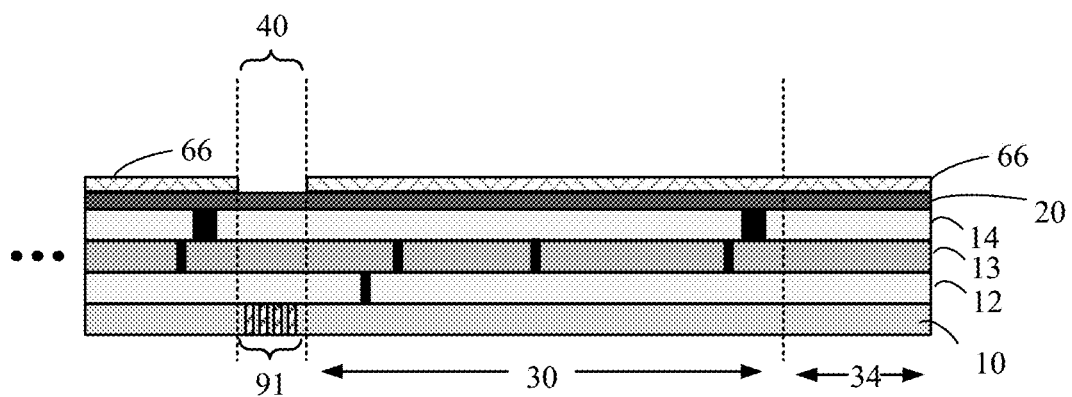

In FIG. 12, the first layer of photoresist 60 is deposited. Following deposition of the first layer of photoresist 60, the photoresist is patterned to form a first patterned layer of photoresist 66 shown in FIG. 13. Notably, alignment marks may be included in many or all of the scribe lines included on the substrate upon which the integrated circuit devices are being formed. As such, the patterning performed corresponding to FIG. 13 may include the provision of numerous windows across the patterned layer of photoresist 66, where each window corresponds to a separate set of alignment marks similar to the alignment marks 91 illustrated in FIG. 13. As was the case with the coarse window used to expose the alignment marks 11 near the periphery of the substrate in the embodiment of FIGS. 2-9, the window provided for each set of alignment marks within the second patterned layer of photoresist 66 in FIG. 13 need not be so precise as in typical etching steps used in formation of features included on the integrated circuit device 30. This is because the scribe lines between the integrated circuits on the substrate provide some leeway with respect to the windows used to expose the underlying alignment marks, where a slight offset will not cause the eventual removal of portions of the plurality of layers 20 intended to remain for later processing in the formation of the magnetoresistive devices.

Figure 14:
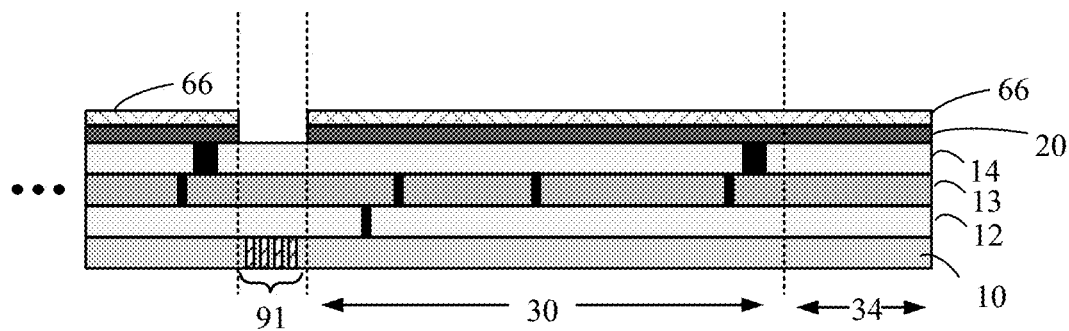
Figure 15:
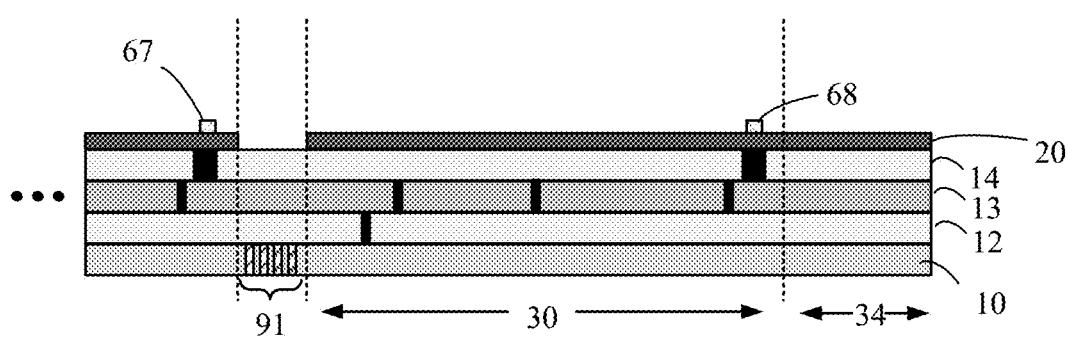

As shown in FIG. 14, selective etching of the plurality of layers 20 using the first patterned layer of photoresist 66 exposes the alignment marks 91 previously obscured by opaque layers within the plurality of layers 20. Following exposure of the alignment marks 91, a second patterned layer of photoresist is formed as is shown in FIG. 15. The second patterned layer of photoresist includes features 67 and 68 that are used in subsequent etching operations to form the magnetoresistive devices. Thus, after subsequent etching the result will be similar to that shown in FIGS. 8 and 9 in which the magnetoresistive devices 24 and 25 are present, but the alignment marks are included in the scribe line 40 rather than near the periphery in the region 34.

Figure 16:
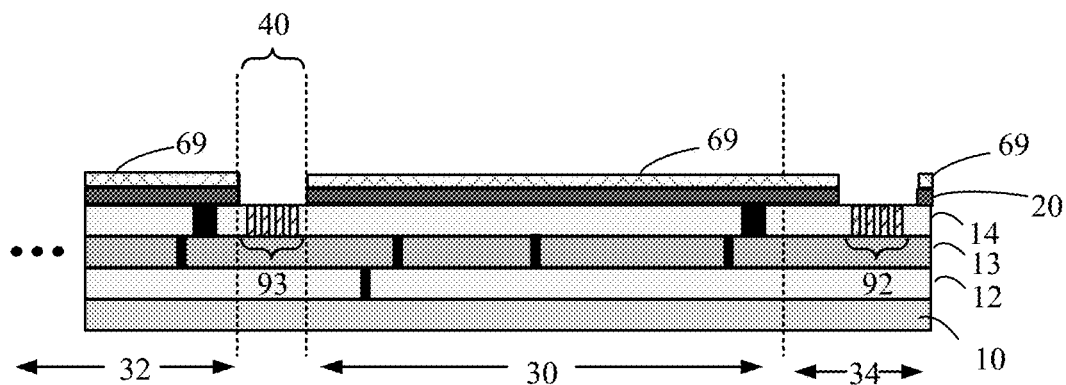
Figure 17:
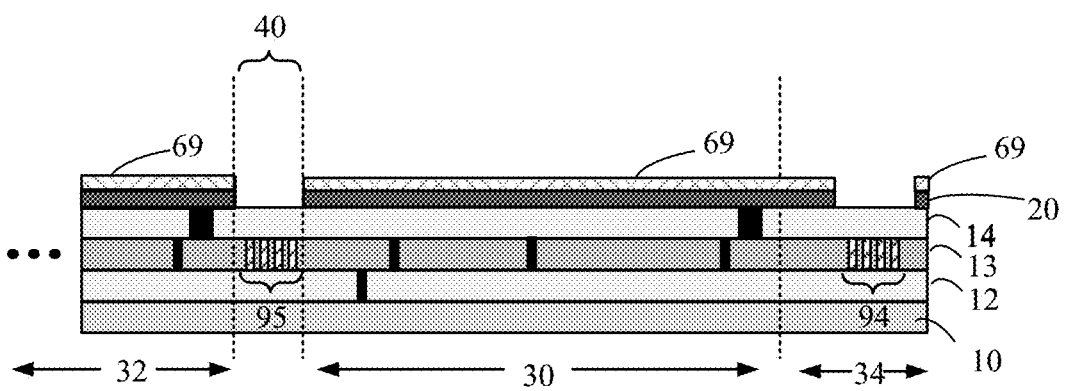

In the embodiments illustrated in FIGS. 2-9 and 10-15, the alignment marks 11 and 91 are included in the zero layer underlying many layers corresponding to the integrated circuit devices. In alternate embodiments, alignment marks can be formed in the layers underlying the plurality of layers corresponding to the magnetoresistive device prior to deposition of the plurality of layers corresponding to the magnetoresistive device. For example, as shown in FIG. 16, alignment marks 92 near the periphery of the substrate are formed within the layer 14 corresponding to the via underlying the eventually produced magnetoresistive device. Because the alignment marks 92 are obscured by the plurality of layers 20 corresponding to the magnetoresistive devices, a first layer of photoresist 69 can be formed and used to etch through opaque layers within the plurality of layers 20 in order to expose the underlying alignment marks 92. Similarly, alignment marks 93 included in the scribe line 40 of the substrate can be formed prior to deposition of the plurality of layers 20 corresponding to the magnetoresistive devices and later exposed by selective etching using the first patterned layer of photoresist 69. While FIG. 16 shows alignment marks included both near the periphery (e.g. alignment marks 92) and in the scribe lines (e.g. alignment marks 93), in operation alignment marks need not be included in both locations. Similarly, while FIG. 16 shows the alignment marks 92 and 93 included in the layer corresponding to the via is underneath the magnetoresistive devices formed on the integrated circuits, FIG. 17 shows alignment marks 94 and 95 formed in what may be an underlying metal layer 14. Similarly, in an embedded MRAM integrated circuit, the alignment marks may be formed in a layer corresponding to underlying layers in which the logic devices are formed or in a layer between the underlying layers in which the plurality of logic devices are formed and the plurality of layers 20 corresponding to the magnetoresistive device.

Figure 18:
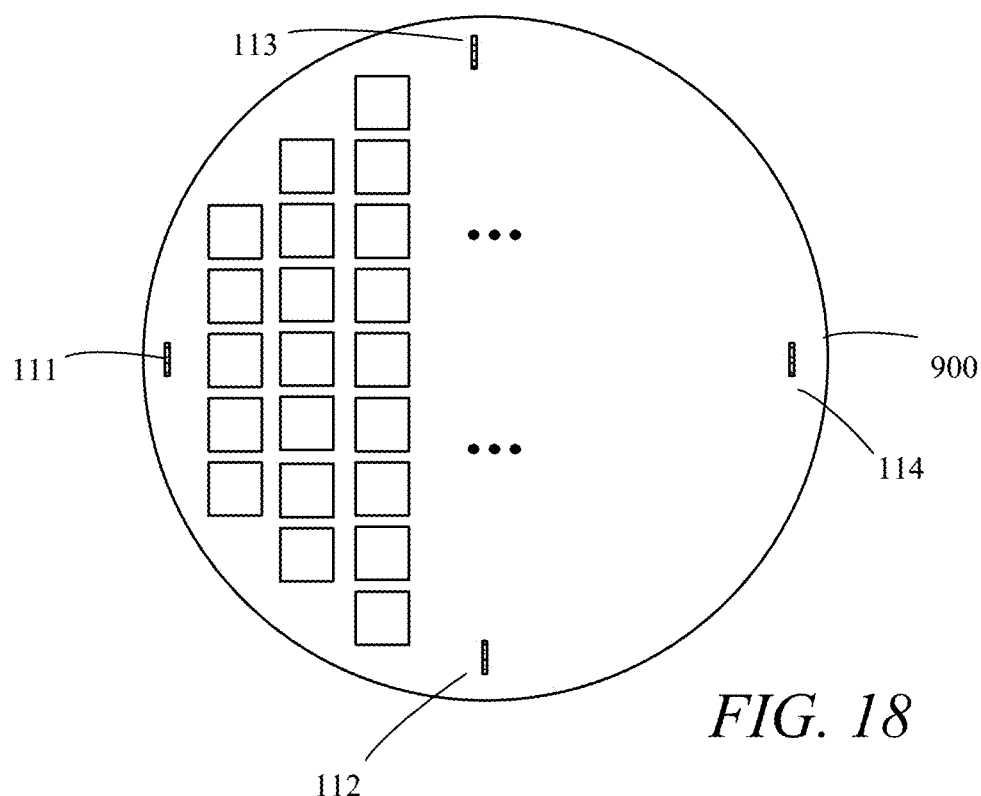
FIG. 18 illustrates a view of another substrate upon which a number of integrated circuit devices that include magnetoresistive devices are formed.

While the embodiments of FIGS. 2-17 correspond to exposure of underlying alignment marks by selectively etching away material included in the plurality of layers corresponding to the magnetoresistive devices to be formed, in other embodiments, the deposition of the plurality of layers corresponding to the magnetoresistive devices can be controlled such that the alignment marks already present or recently formed on the substrate are not obscured by the deposition of the plurality of layers corresponding to the magnetoresistive devices. As shown in FIG. 18, the substrate 900 includes alignment marks 111-114. Because the deposition of the plurality of layers corresponding to the magnetoresistive device is typically done in a blanket deposition format, the deposition of those layers would normally cover the alignment marks 111-114, thereby obscuring them from view and preventing their use in aligning the operations used to form the magnetoresistive devices.

Figure 19:
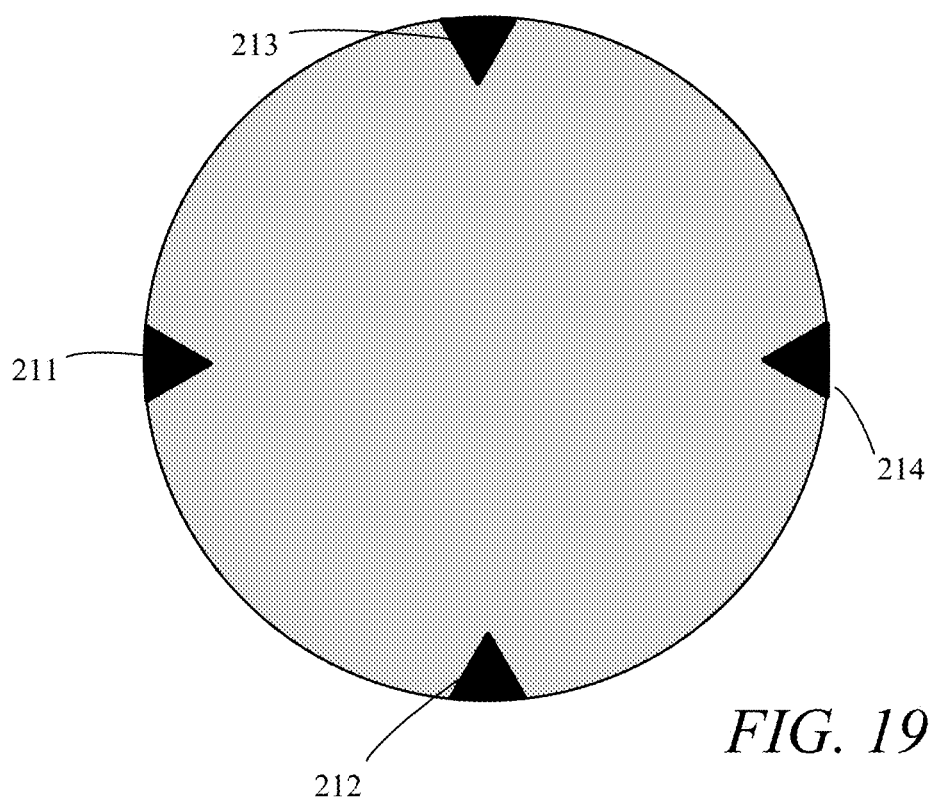
FIG. 19 illustrates deposition tool tabs used in manufacturing magnetoresistive devices in accordance with another exemplary embodiment.

In order to avoid obscuring the alignment marks 111-114, a deposition tool tab is positioned over the substrate upon which the magnetoresistive devices are to be formed. The deposition tool tab is positioned based on a location of the alignment marks on the substrate such that during deposition of the plurality of layers corresponding to the magnetoresistive devices, the deposition tool tab selectively prevents deposition of material corresponding to at least a portion of the plurality of layers in a region corresponding to the alignment marks such that the alignment marks are not obscured by the deposition of the plurality of layers. As shown in FIG. 19, a plurality of deposition tool tabs 211-214 can be strategically placed in order to prevent deposition of material in the areas corresponding to those tool tabs 211-214. Because the alignment marks 111-114 are near the periphery of the substrate 900, no magnetoresistive device formation is anticipated within the regions excluded from deposition by the deposition tool tabs 211-214. Thus, the alignment marks 111-114 are prevented from being obscured, while the lack of deposition of magnetic materials within the excluded regions is inconsequential in the formation of the integrated circuits included on the substrate 900.

By using the deposition tool tabs to prevent opaque material corresponding to the plurality of layers for the magnetoresistive devices from overlying the alignment marks 111-114, those alignment marks are visible following the deposition of the plurality of layers corresponding to the magnetoresistive devices. As such, a patterned layer of photoresist can be formed following the deposition of the plurality of layers corresponding to the magnetoresistive devices, where the patterned layer of photoresist uses the alignment marks in order to correctly position the pattern to facilitate etching of the magnetoresistive devices with the precision aided by the alignment marks.

As discussed above, the alignment marks that are prevented from being obscured by the deposition tool tabs may be alignment marks included in the zero layer of the substrate, and thus may be the same alignment marks used to create other features on the integrated circuits included on the substrate. For example, a plurality of logic devices may be formed on an integrated circuit using the same alignment marks that are later used to produce the magnetoresistive devices. In other embodiments, the alignment marks may be formed shortly before deposition of the plurality of layers corresponding to the magnetoresistive devices such that the alignment marks are different from other alignment techniques used to produce underlying or overlying circuitry. Notably, the accuracy with which the alignment marks can be used may be impacted by their proximity to the surface of the structure upon which the magnetoresistive devices are being performed. Alignment marks closer to the top surface may provide added accuracy for etching operations, and thus it may be advantageous to form additional alignment marks just before depositing the plurality of layers corresponding to the magnetoresistive devices.

Figure 20:
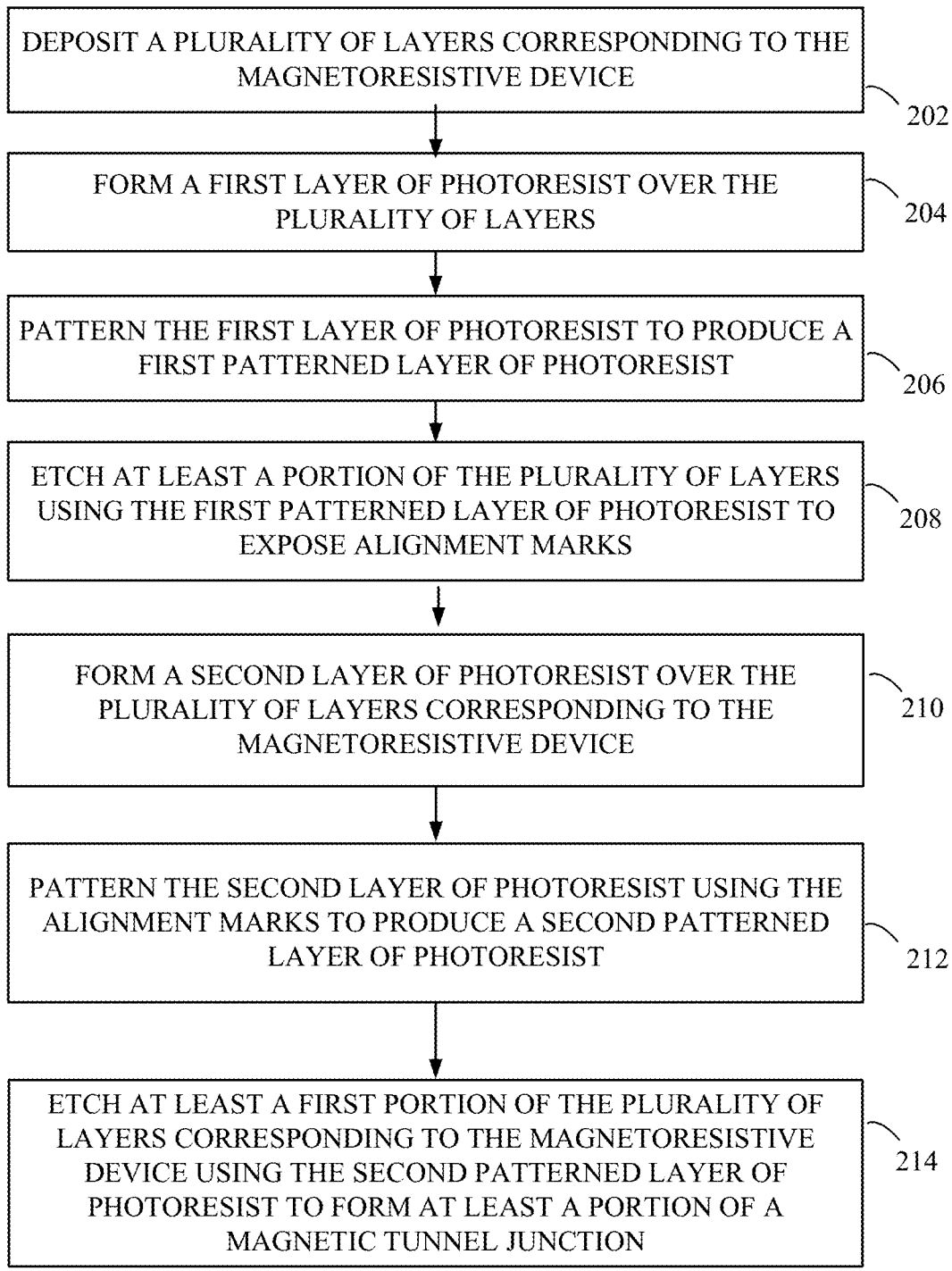
FIGS. 20-22 are flow charts of methods of manufacturing a magnetoresistive device in accordance with exemplary embodiments.
Figure 21:
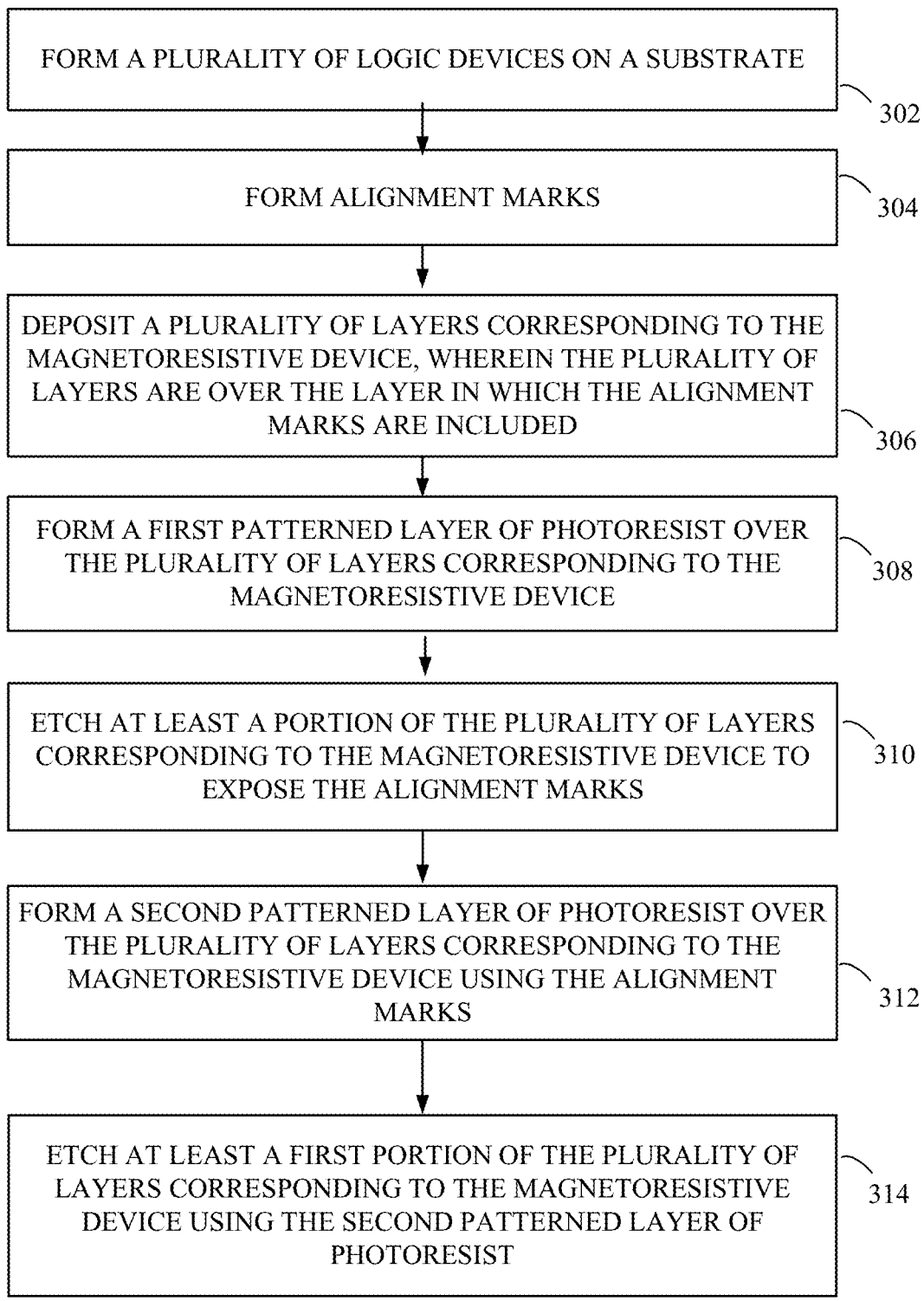
Figure 22:
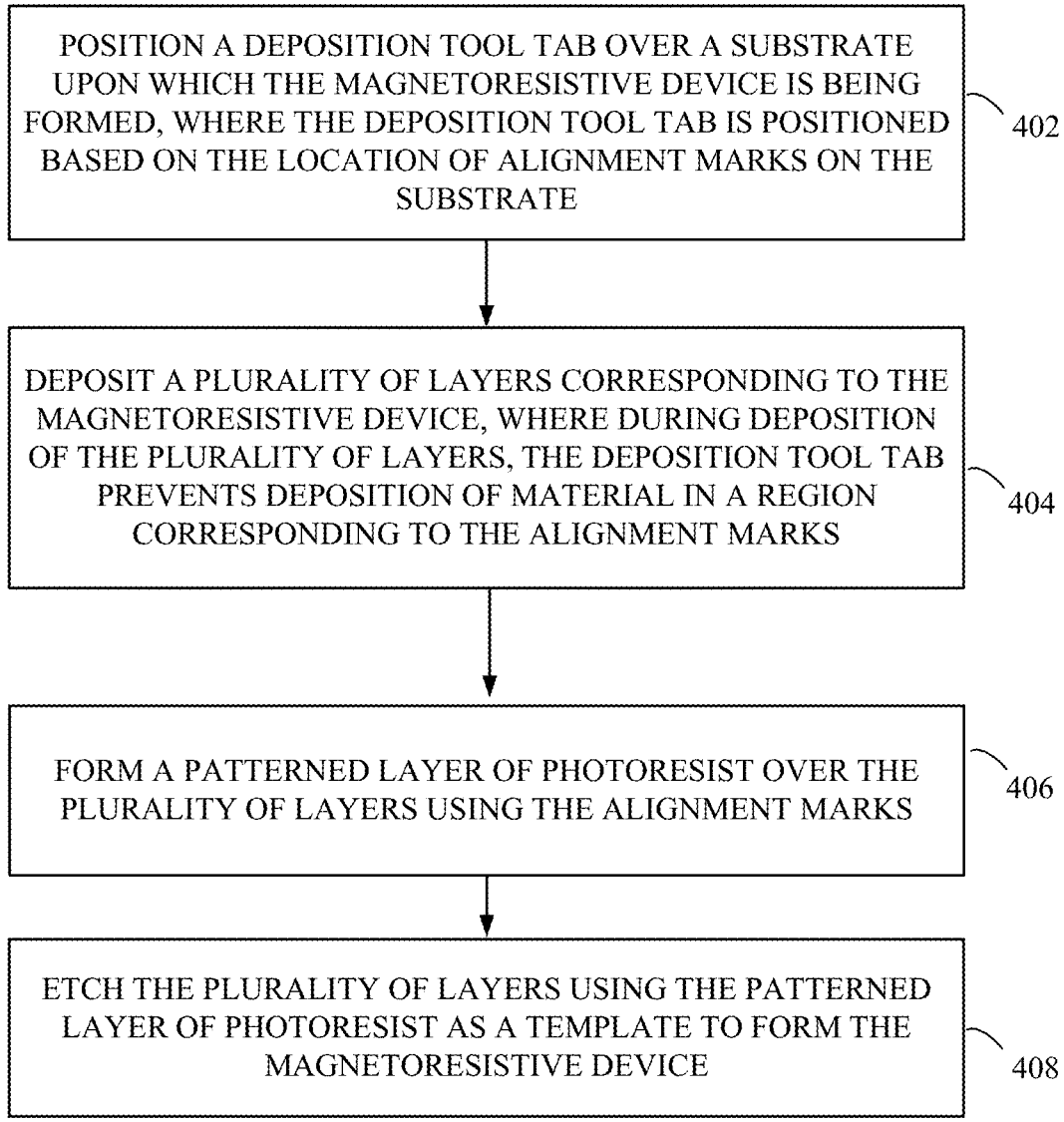

FIGS. 20-22 are flow charts that illustrate exemplary embodiments of a method of manufacturing a magnetoresistive device, where, in one example, the magnetoresistive device includes a spin-torque MTJ device included in a sensor, an MRAM, or embedded MRAM integrated circuit. The operations included in the flow charts may represent only a portion of the overall process used to manufacture the device. For illustrative purposes, the following description of the methods in FIGS. 20-22 may refer to elements mentioned above in connection with FIGS. 1-19. It should be appreciated that the methods may include any number of additional or alternative tasks, the tasks shown in FIGS. 20-22 need not be performed in the illustrated order, and the methods may be incorporated into a more comprehensive procedure or process having additional functionality not described in detail herein. Moreover, one or more of the tasks shown in FIGS. 20-22 could be omitted from an embodiment as long as the intended overall functionality remains intact.

FIG. 20 illustrates a flow chart of a portion of the magnetoresistive device manufacturing process. At 202 a plurality of layers corresponding to a magnetoresistive device is deposited. Depositing the plurality of layers obscures alignment marks underlying the plurality of layers corresponding to the magnetoresistive device. At 204 a first layer of photoresist is formed over the plurality of layers corresponding to the magnetoresistive device. At 206, the first layer of photoresist is patterned to produce a first patterned layer of photoresist. Notably the first patterned layer of photoresist is formed without the use of the underlying alignment marks, which are currently not detectable due to the deposition of the material for the magnetoresistive devices.

At 208 at least a portion of the plurality of layers corresponding to the magnetoresistive devices is etched using the first patterned layer of photoresist to expose the alignment marks. Thus, as shown in the embodiments discussed above with respect to FIGS. 2-15, windows can be created in the first patterned layer of photoresist that allows for etching of the plurality of layers to selectively occur in a manner that reveals the underlying alignment marks.

At 210 a second layer of photoresist is formed over the plurality of layers corresponding to the magnetoresistive device. The second layer of photoresist is then patterned at 212 using the alignment marks to produce a second patterned layer of photoresist. Thus, once the alignment marks are exposed, they can be used as a reference to position the reticle(s) used to pattern the magnetoresistive devices. The second patterned layer of photoresist is then used at 214 to etch at least a first portion of the plurality of layers corresponding to the magnetoresistive device and thereby form at least a portion of a magnetic tunnel junction included in the magnetoresistive device. As noted above, the etching operations used to form the magnetoresistive devices can include a single step etch or multiple etching operations that may or may not be interspersed with encapsulation operations.

FIG. 21 illustrates a flow chart of a portion of the magnetoresistive device manufacturing process in an embodiment in which the logic devices are also included on the substrate upon which the magnetoresistive device is being formed. At 302 a plurality of logic devices is formed on a substrate, where the substrate includes alignment marks or other alignment references that are used in forming the plurality of logic devices. In some embodiments, the same alignment marks used to form the logic devices can be used for the later patterning and etching operations used to form the magnetoresistive devices. In other embodiments, such as the one illustrated in FIG. 21, additional alignment marks are formed at 304, where the new alignment marks are closer to the surface of the structure, thereby providing increased accuracy for magnetoresistive device formation. As noted above, the formation of additional alignment marks at 304 is an optional step, and in other embodiments the same alignment marks used to form the logic devices are used to form the magnetoresistive devices.

At 306 a plurality of layers corresponding to the magnetoresistive devices is deposited, where the plurality of layers are deposited over the layer in which the alignment marks are included. At 308 a first patterned layer of photoresist is formed over the plurality of layers corresponding to the magnetoresistive device. In some embodiments, the first patterned layer of photoresist corresponds to an area proximal to an edge of a wafer on which the magnetoresistive device is being formed. This corresponds to the embodiment discussed above with respect to FIGS. 2-9 where the first patterned layer of photoresist is used to expose alignment marks near the periphery of the substrate. In other embodiments, the first patterned layer photoresist may be directed to an area included in scribe lines on the wafer, similar to the embodiments discussed with respect to FIGS. 10-15 above.

At 310 at least a portion of the plurality of layers corresponding to the magnetoresistive device are etched to expose the alignment marks underlying the plurality of layers. At 312 a second patterned layer photoresist is formed over the plurality of layers corresponding to the magnetoresistive device, where the second patterned layer of photoresist can be patterned using the alignment marks which are now visible based on their exposure at 310. At 314 at least a portion of the plurality of layers corresponding to the magnetoresistive device is etched using the second patterned layer of photoresist. In some embodiments, the entirety of the magnetoresistive device is etched using the second patterned layer of photoresist, whereas in other embodiments more patterning and etching steps may be required, where those patterning and etching steps may also rely on the now detectable alignment marks.

FIG. 22 illustrates a flow chart of a portion of the magnetoresistive device manufacturing process using deposition tool tabs to avoid obscuring underlying alignment marks during deposition of the layers of material used to produce the magnetoresistive devices. At 402 a deposition tool tab is positioned over a substrate upon which the magnetoresistive device is being formed. The deposition tool tab is positioned based on the location of alignment marks on the substrate. When using deposition tool tabs, the alignment marks are typically near the periphery of the substrate, as the deposition tool tabs are less likely to interfere with any of the integrated circuits on the substrate when positioned near the periphery.

At 404 a plurality of layers corresponding to the magnetoresistive device is deposited, where during deposition of the plurality of layers the deposition tool tab selectively prevents deposition of material corresponding to a least a portion of the plurality of layers in a region corresponding to the alignment marks such that the alignment marks are not obscured by the deposition of the plurality of layers. Thus, the deposition tool tab prevents opaque layers from being deposited overlying the alignment marks, thereby preventing those alignment marks from being obscured.

At 406 a patterned layer of photoresist is formed over the plurality of layers using the alignment marks that were not obscured during the deposition of the plurality of layers corresponding to the magnetoresistive devices. At 408 that patterned layer of photoresist, the positioning of which was able to rely on the alignment marks, is used to etch the plurality of layers and form the magnetoresistive devices on the integrated circuit.

Techniques presented herein enable alignment marks that would normally be obscured by the deposition of layers of material corresponding to magnetoresistive devices to be used in the formation of such magnetoresistive devices. In some embodiments, the alignment marks are initially obscured by the plurality of layers corresponding to the magnetoresistive devices. Selective etching is used to expose those alignment marks for use in patterning the magnetoresistive devices. In other embodiments, deposition tool tabs are used during the deposition of the layers corresponding to the magnetoresistive devices, where the deposition tool tabs prevent the material from covering the alignment marks.

Although the described exemplary embodiments disclosed herein are directed to various magnetoresistive-based devices and methods for making such devices, the present disclosure is not necessarily limited to the exemplary embodiments, which illustrate inventive aspects that are applicable to a wide variety of semiconductor processes and/or devices. Thus, the particular embodiments disclosed above are illustrative only and should not be taken as limitations, as the embodiments may be modified and practiced in different but equivalent manners apparent to those skilled in the art having the benefit of the teachings herein. Accordingly, the foregoing description is not intended to limit the disclosure to the particular form set forth, but on the contrary, is intended to cover such alternatives, modifications and equivalents as may be included within the spirit and scope of the inventions as defined by the appended claims so that those skilled in the art should understand that they can make various changes, substitutions and alterations without departing from the spirit and scope of the inventions in their broadest form.

What is claimed is:

1. A method of manufacturing a magnetoresistive device, comprising:
    depositing a plurality of layers corresponding to the magnetoresistive device, wherein depositing the plurality of layers corresponding to the magnetoresistive device obscures alignment marks underlying the plurality of layers;
    forming a first layer of photoresist over the plurality of layers corresponding to the magnetoresistive device;
    patterning the first layer of photoresist to produce a first patterned layer of photoresist;
    etching at least a portion of the plurality of layers corresponding to the magnetoresistive device using the first patterned layer of photoresist as a template, wherein etching the at least a portion of the plurality of layers corresponding to the magnetoresistive device exposes the alignment marks underlying the plurality of layers;
    after etching the at least a first portion of the plurality of layers corresponding to the magnetoresistive device, forming a layer of encapsulating material that obscures the alignment marks;
    after forming the layer of encapsulating material, selectively removing portions of the encapsulating material to expose the alignment marks; and
    after selectively removing portions of the encapsulating material, etching a second portion of the plurality of layers corresponding to the magnetoresistive device.

2. The method of claim 1, wherein depositing the plurality of layers corresponding to the magnetoresistive device includes depositing a conductive layer corresponding to a bottom electrode for the magnetoresistive device, wherein the conductive layer corresponding to the bottom electrode obscures the alignment marks, and wherein the etching at least a portion of the plurality of layers removes a portion of the conductive layer corresponding to the bottom electrode that overlies the alignment marks.

3. The method of claim 1, wherein depositing the conductive layer corresponding to the bottom electrode further comprises depositing a layer of tantalum (Ta).

4. The method of claim 1, wherein depositing the plurality of layers corresponding to the magnetoresistive device further comprises depositing a first conductive layer corresponding to a bottom electrode, depositing a first magnetic layer over the first conductive layer, depositing a dielectric layer over the first magnetic layer, and depositing a second magnetic layer over the dielectric layer.

5. The method of claim 1, further comprises:
    after etching the at least a portion of the plurality of layers corresponding to the magnetoresistive device using the first patterned layer of photoresist as a template and exposing the alignment marks underlying the plurality of layers, forming a second layer of photoresist over the plurality of layers corresponding to the magnetoresistive device;

patterning the second layer of photoresist using the alignment marks to produce a second patterned layer of photoresist; and etching at least a first portion of the plurality of layers corresponding to the magnetoresistive device using the second patterned layer of photoresist, wherein etching using the second patterned layer of photoresist forms at least a portion of a magnetic tunnel junction included in the magnetoresistive device.

6. The method of claim 1, further comprises:

prior to depositing the plurality of layers corresponding to the magnetoresistive device, forming the alignment marks in an underlying layer underlying the plurality of layers corresponding to the magnetoresistive device, wherein the underlying layer corresponds to one of a metal layer and a layer in which vias are formed.

7. The method of claim 6, wherein the magnetoresistive device is included in an integrated circuit manufactured on a wafer, and wherein forming the alignment marks further comprises forming the alignment marks in scribe lines between integrated circuits being formed on the wafer.

8. The method of claim 6, wherein the magnetoresistive device is included in an integrated circuit manufactured on a wafer, and wherein forming the alignment marks further comprises forming the alignment marks proximal to a periphery of the wafer in an area of the wafer devoid of integrated circuits.

9. The method of claim 1, further comprises:

prior to depositing the plurality of layers corresponding to the magnetoresistive device, forming a plurality of logic devices in underlying layers underlying the plurality of layers corresponding to the magnetoresistive device.

10. The method of claim 9, further comprises:

prior to depositing the plurality of layers corresponding to the magnetoresistive device, forming the alignment marks in an underlying layer underlying the plurality of layers corresponding to the magnetoresistive device, wherein the underlying layer in which the alignment marks are formed corresponds to layer included in the underlying layers in which the plurality of logic devices are formed or a layer between the underlying layers in which the plurality of logic devices are formed and the plurality of layers corresponding to the magnetoresistive device.

11. The method of claim 1, wherein etching at least a portion of the plurality of layers corresponding to the magnetoresistive device using the first patterned layer of photoresist as a template removes selective portions of all opaque layers included in the plurality of layers corresponding to the magnetoresistive device.

12. The method of claim 1, wherein etching at least a portion of the plurality of layers corresponding to the magnetoresistive device using the first patterned layer of photoresist as a template removes selective portions of all opaque layers using a single-step etch.

13. The method of claim 1, wherein etching at least a portion of the plurality of layers corresponding to the magnetoresistive device using the first patterned layer of photoresist as a template removes selective portions of all opaque layers using a first etch and a second etch, wherein the first and second etches have different etching characteristics.

14. The method of claim 1, wherein forming the first patterned layer of photoresist further comprises forming the first patterned layer of photoresist to correspond to an area proximal to an edge of a wafer on which the magnetoresistive device is being formed.

15. The method of claim 1, wherein forming the first patterned layer of photoresist further comprises forming the first patterned layer of photoresist to correspond to an area included in a scribe line of a wafer on which the magnetoresistive device is being formed.

16. The method of claim 1, further comprising positioning a deposition tool tab over a substrate upon which the magnetoresistive device is being formed, wherein the deposition tool tab is positioned based on a location of alignment marks on the substrate.

17. The method of claim 16, wherein during deposition of the plurality of layers, the deposition tool tab selectively prevents deposition of material corresponding to at least a portion of the plurality of layers in a region corresponding to the alignement marks.

18. The method of claim 1, wherein selectively removing portions of the encapsulating material to expose the alignment marks includes not removing portions of the encapsulating material disposed on a sidewall of the plurality of layers corresponding to the magnetoresistive device.

19. The method of claim 1, wherein depositing a plurality of layers corresponding to the magnetoresistive device comprises:

depositing a first magnetic layer;

depositing a dielectric layer over the first magnetic layer; and depositing a second magnetic layer over the dielectric layer.

20. The method of claim 19, wherein etching the at least a portion of the plurality of layers corresponding to the magnetoresistive device includes etching a portion of the first magnetic layer, a portion of the dielectric layer, and a portion of the second magnetic layer.

* * * * *